(12) United States Patent
Yang

(10) Patent No.: US 6,238,934 B1
(45) Date of Patent: May 29, 2001

(54) METHOD FOR FABRICATING FERROELECTRIC CAPACITOR WITH IMPROVED INTERFACE SURFACE CHARACTERISTIC

(75) Inventor: Woo-Seok Yang, Ichon-shi (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/467,755

(22) Filed: Dec. 20, 1999

(30) Foreign Application Priority Data

Dec. 30, 1998 (KR) ................................. 98-61175

(51) Int. Cl.[7] ....................................... H01L 21/00
(52) U.S. Cl. .......................... 438/3; 438/240; 438/396; 148/DIG. 3
(58) Field of Search ................... 438/240, 3, 396; 148/DIG. 3

(56) References Cited

U.S. PATENT DOCUMENTS 5,374,578 * 12/1994 Patel et al. ................................. 438/3
5,728,603   3/1998 Emesh et al. .
5,751,450   5/1998 Robinson .
5,886,867   5/1999 Chivukula et al. .

FOREIGN PATENT DOCUMENTS 7-3431    6/1995 (JP) .
8-339715 12/1996 (JP) .
10-4181   1/1998 (JP) .

* cited by examiner

Primary Examiner—Charles Bowers
Assistant Examiner—Craig Thompson
(74) Attorney, Agent, or Firm—Blakely Sokoloff Taylor & Zafman

(57) ABSTRACT

A method for fabricating a ferroelectric capacitor in a ferroelectric memory device includes the steps of forming a first conductive layer on a semiconductor structure prepared for a formation of ferroelectric capacitor, forming a first ferroelectric layer on said first conductive layer, carrying out a rapid thermal annealing for nucleation in said ferroelectric layer, forming a second conductive layer on said ferroelectric layer, and carrying out a thermal treatment for a grain growth in said ferroelectric layer, thereby the interface characteristics are improved, reducing leakage currents and preventing a peeling phenomenon during a following etching process.

10 Claims, 8 Drawing Sheets

METHOD FOR FABRICATING FERROELECTRIC CAPACITOR WITH IMPROVED INTERFACE SURFACE CHARACTERISTIC

FIELD OF THE INVENTION

The present invention relates to a method for fabricating a semiconductor device; and, more particularly, to a method for fabricating a ferroelectric capacitor in ferroelectric memory device, in which an interface surface characteristic is improved and a peeling phenomenon is prevented.

DESCRIPTION OF THE PRIOR ART

A ferroelectric random access memory (FeRAM) is a kind of non-volatile memory device. The FeRAM retains stored data even when a power is removed and its operating speed is comparable to the dynamic random access memory (DRAM). Therefore, the FeRAM is calling attention as the next generation memory device. The FeRAM generally uses ferroelectric materials, such as $Sr_xBi_yTa_2O_9$ (SBT) or $Pb(Zr_xTi_{1-x})O_3$ (PZT), as a ferroelectric layer. An appropriate selection of materials for bottom and top electrodes as well as an appropriate processing control are essential for obtaining an excellent properties of the ferroelectric layer.

In fabricating the ferroelectric capacitor having a Bi-layered perovskite structure, the ferroelectric layer is coated on a bottom electrode, which is typically made of a metal such as Pt, and thereafter a high-temperature thermal treatment is carried out for forming a ferroelectric dielectric medium. The conventional thermal treatment for forming the ferroelectric dielectric medium includes a two-stage process. That is, a RTA (rapid thermal annealing) process is carried out for nucleation in the ferroelectric dielectric medium, and then, a furnace annealing is carried out for a grain growth in the nucleated ferroelectric dielectric medium. Both the RTA process and the furnace annealing are carried out in an $O_2$ atmosphere at a temperature of 700° C. to 800° C. The typical processing time is 0.5 minutes in the RTA process, and 60 minutes in the furnace annealing process.

Unlike the RTA process which is completed in a short time, the furnace annealing is carried out for a long time at a high temperature, causing a thermally induced mechanical damage. The thermally induced mechanical damage occurs due to the difference between the thermal expansion coefficient of a silicon oxide located under the lower electrode and that of the metallic electrode. This thermally induced mechanical damage weakens the adhesion between the metal and the oxides, with the result that a peeling phenomenon occurs during an etching process after deposition of an upper electrode, thereby decreasing the yield of the device.

Meanwhile, in the ferroelectric layer in which only the nucleation occurs after the RTA process, the interface roughness is not rough, and a dense structure without pores is formed. However, the ferroelectric layer, in which the grain growth occurs after the furnace annealing, shows a high interface roughness and holds numerous pores. Therefore, if an upper electrode is formed on the ferroelectric layer in which the grain growth occurs after the furnace annealing, the interface surface is very severe, and numerous pores are present on the interface between the ferroelectric layer and the upper electrode. As a result, leakage currents are increased and therefore, the ferroelectric capacitor is greatly degraded.

SUMMARY OF THE INVENTION

It is, therefore, an object of the present invention to provide a method for fabricating a ferroelectric capacitor in ferroelectric memory device, in which an interface characteristic is improved and a peeling phenomenon is prevented.

In accordance with an embodiment of the present invention, there is provided a method for fabricating a ferroelectric capacitor in ferroelectric memory device, comprising the steps of: a) forming a first conductive layer on a semiconductor structure prepared for a formation of the ferroelectric capacitor; b) forming a ferroelectric layer on said first conductive layer; c) carrying out a rapid thermal annealing for nucleation in said ferroelectric layer; d) forming a second conductive layer on said ferroelectric layer; and e) carrying out a thermal treatment for a grain growth in said ferroelectric layer.

In accordance with another embodiment of the present invention, there is provided a method for fabricating a ferroelectric capacitor in a ferroelectric memory device, comprising the steps of: a) forming a first conductive layer on a semiconductor structure prepared for a formation of a ferroelectric capacitor; b) forming a ferroelectric layer having a Bi-layered perovskite structure on said first conductive layer; c) carrying out a rapid thermal annealing for nucleation in said ferroelectric layer; d) forming a second conductive layer on said ferroelectric; e) selectively etching said second conductive layer, said ferroelectric layer and said first conductive layer to form said ferroelectric capacitor; f) carrying out a thermal treatment for compensating damages caused during an etching and for promoting grain growth in said ferroelectric layer; g) forming an interlayer insulating layer, making planarization flow of said interlayer insulating layer, and carrying out a thermal treatment for a grain growth in said ferroelectric layer; and h) etching said interlayer insulating layer to expose said second conductive layer, and carrying out a heat treatment for compensating damages occurred during an etching of said interlayer insulating and for promoting a grain growth in said ferroelectric layer.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

FIGS. 1A to 1F are sectional views showing a method for fabricating the ferroelectric capacitor according to the present invention.

Figure 1A:
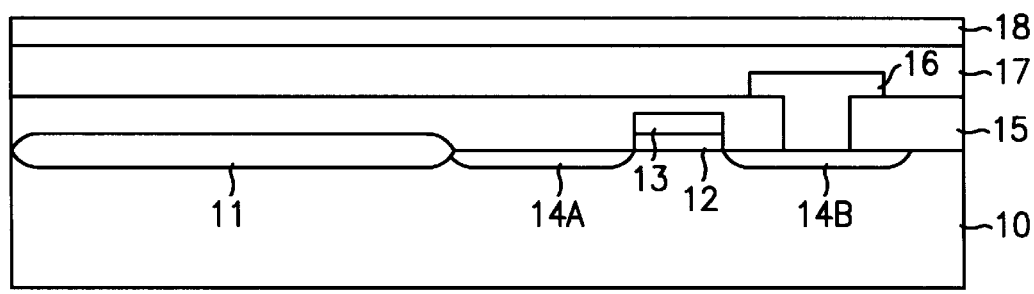
FIGS. 1A to 1F are sectional views showing a method for fabricating a ferroelectric capacitor in accordance with the present invention.

Referring to FIG. 1A, an interlayer insulating layer 17 such as BPSG (borophosphosilicate glass) is formed on a semiconductor structure prepared for a formation of the capacitor. Then an HTO (high temperature oxide) layer 18 is formed on the interlayer insulating layer 17 for a passivation. Here, a reference numeral 10 represents a semiconductor substrate, 11 an element isolating layer, 12 a gate oxide layer, 13 a gate electrode, 14A and 14B source and drain of a transistor, 15 and 17 interlayer insulating layers, and 16 a bit line.

Figure 1B:
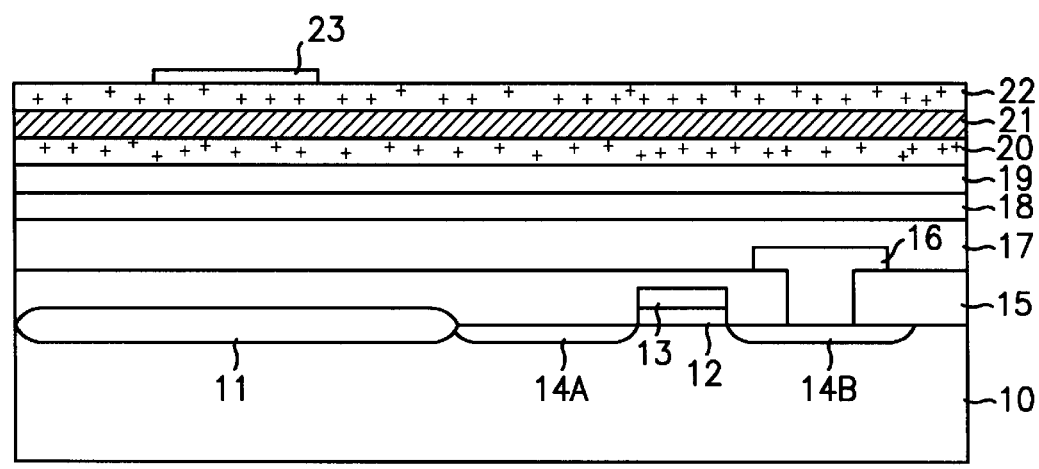

Referring to FIG. 1B, an adhesion layer 19 is formed on the HTO layer 18 by using Ti or $TiO_2$. Then, a first conductive layer 20 is formed on the adhesion layer 19 by using, e.g., Pt, Ir, Ru or Pt alloy for a bottom electrode of the capacitor. Then, a ferroelectric thin film 21 having a Bi-layered perovskite structure is formed on the first conductive layer 20 by using SBT ($Sr_xBi_yTa_2O_9$) or SBTN ($Sr_xBi_y(Ti_iNb_j)_2O_9$), where x is 0.7 to 1.0, y is 2.0 to 2.6, i is 0.7 to 0.9, and j is 0.1 to 0.3.

Then, an RTA process for nucleation of the ferroelectric layer 21 is carried out at a temperature of 700° C. to 800° C. in an $O_2$ atmosphere for 0.4 to 0.6 minutes. At this time, the conventional furnace annealing for the grain growth is omitted. Thereafter, a second conductive layer 22 as a top electrode is formed on the ferroelectric layer 21 by using, e.g., Pt, Ir, Ru or a Pt alloy. Then a hard mask 23 is formed by using TiN.

Figure 1C:
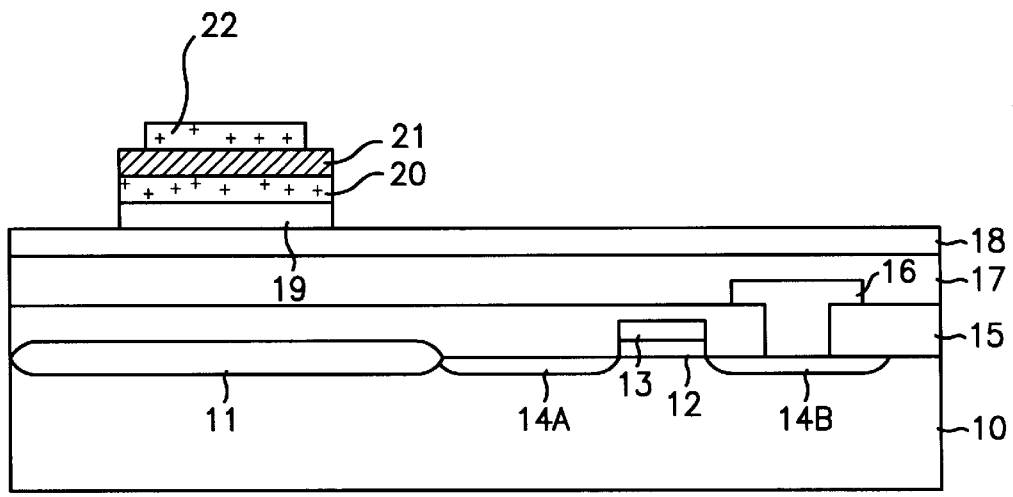

Referring to FIG. 1C, the second conductive layer 22 is etched by using the hard mask 23 as an etch mask. Then the ferroelectric layer 21, the first conductive layer 20 and the adhesion layer 19 are patterned by carrying out an etching process to there form a capacitor.

For recovering a damage caused during the etching process, and promoting the grain growth in the nucleated ferroelectric layer 21, a first recovery annealing is carried out at a temperature of 700° C. to 800° C. in an $O_2$ atmosphere for 25 to 35 minutes.

Figure 1D:
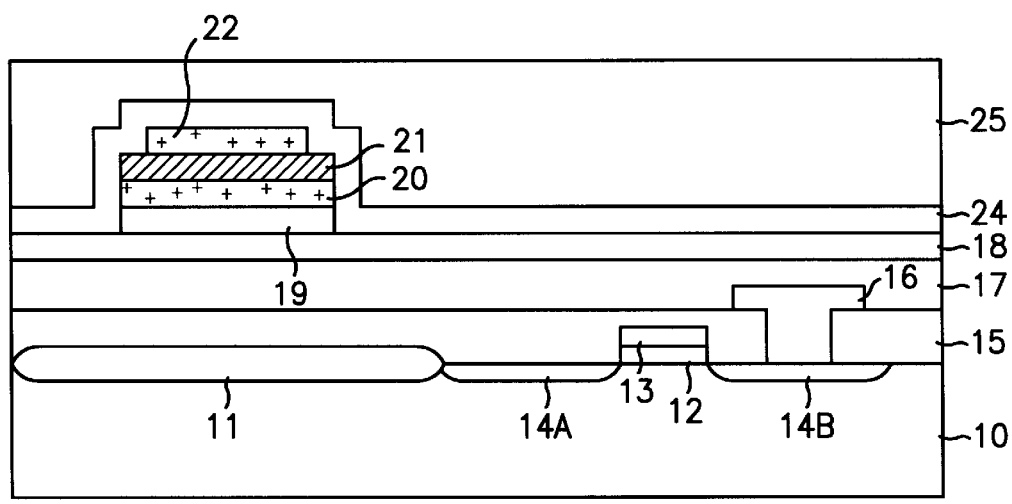

Referring to FIG. 1D, a diffusion preventing layer 24 is formed on the entire structure after completing the formation of the capacitor by using $SiO_2$, $TiO_2$ or $Al_2O_3$. Then an interlayer insulating layer 25 is formed by using BPSG (boro-phosilicate glass) for planarization. Then, in order to make planarization flow of the interlayer insulating layer 25 and to promote the grain growth in the ferroelectric layer 21, a thermal treatment is carried out at a temperature of 750° C. to 850° C. in an $N_2$ atmosphere for 25 to 35 minutes.

Figure 1E:
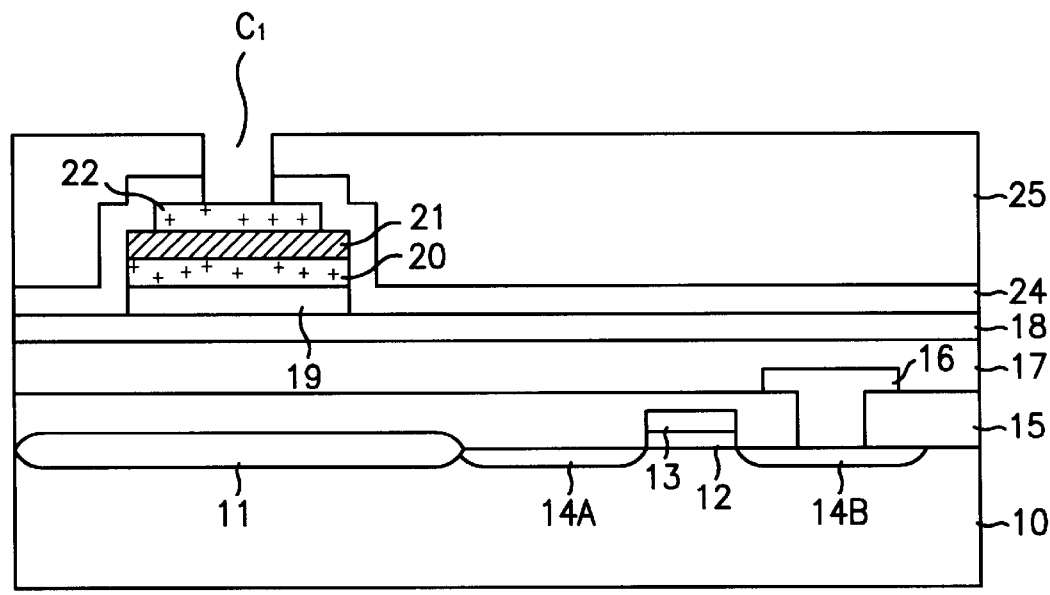

Referring to FIG. 1E, the interlayer insulating layer 25 and the diffusion preventing layer 24 are selectively etched to expose the second conductive layer 22, thereby forming a first contact hole C1. Then, for recovering a damage caused during the etching process of forming the first contact hole C1 and promoting the grain growth in the ferroelectric layer 21, a second recovery annealing is carried out at 700° C. to 800° C. in an $O_2$ atmosphere for 25 to 35 minutes.

Figure 1F:
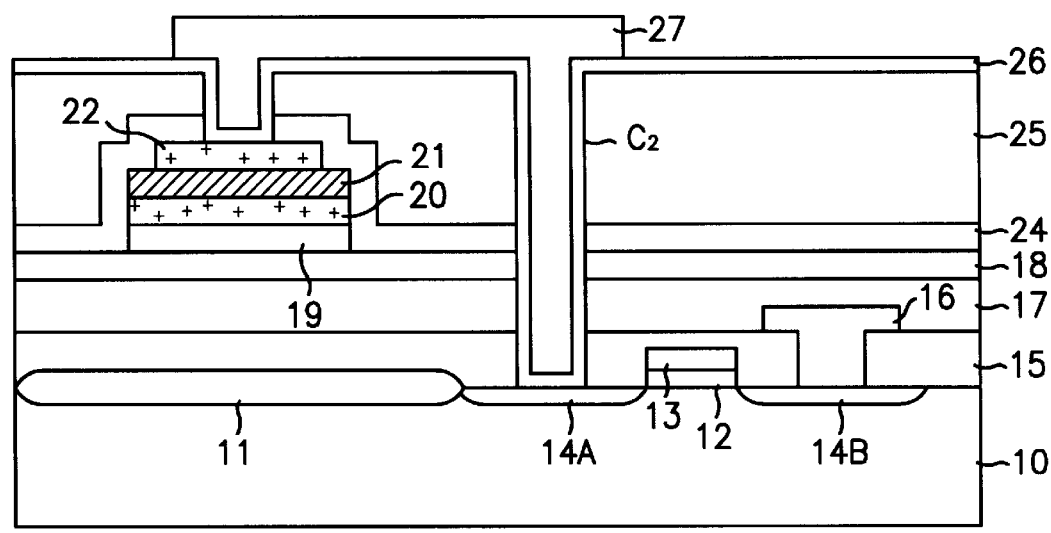

Referring to FIG. 1F, the interlayer insulating layer 25, the diffusion preventing layer 24, the HTO layer 18 and the interlayer insulating layers 17 and 15 are etched to form a second contact hole C2 to expose a source/drain junction 14A of the transistor. Sequentially, Ti and TiN films are stacked to form a metal diffusion preventing layer 26. Then, a metal layer 27 formed by a metal such as Al is patterned to form a metal wiring.

Figure 2A:
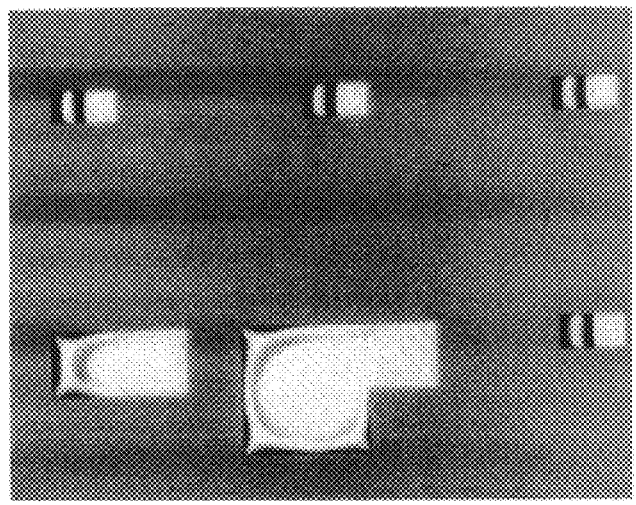
FIGS. 2A and 2B are photographs showing resultant patterns fabricated according to the prior art and the present invention, respectively.
Figure 2B:
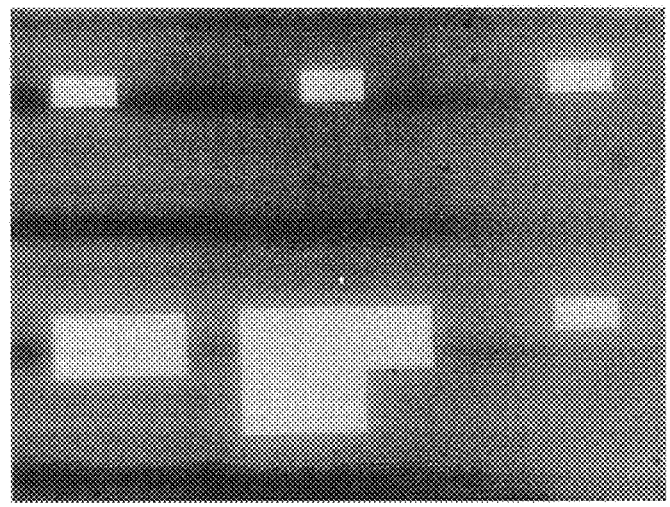

FIGS. 2A to 2B are photographs showing resultant patterns fabricated according to the prior art and the present invention, respectively.

From the comparison of FIGS. 2A and 2B, it can be seen that the peeling phenomenon is greatly diminished.

Figure 3A:
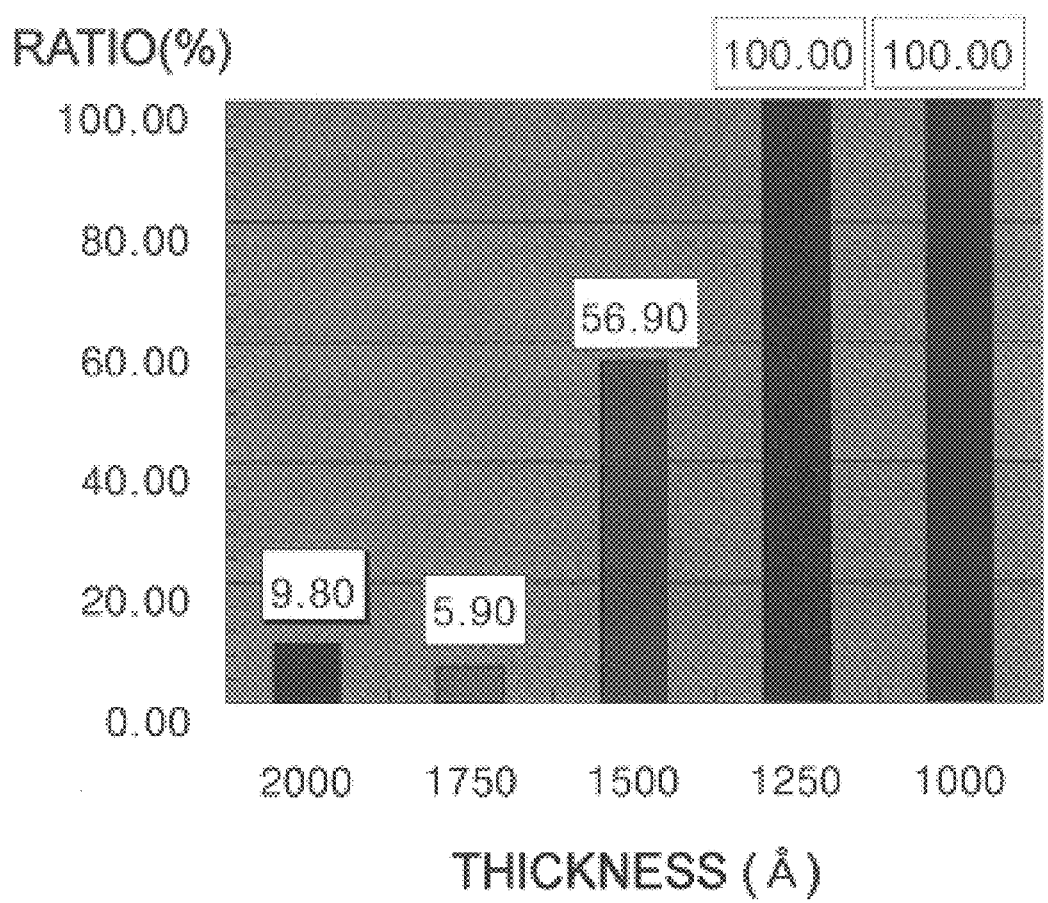
FIGS. 3A and 3B are graphs illustrating a short fail ratio of a capacitor with a different thickness of SBT thin film in accordance with the prior art and the present invention.
Figure 3B:
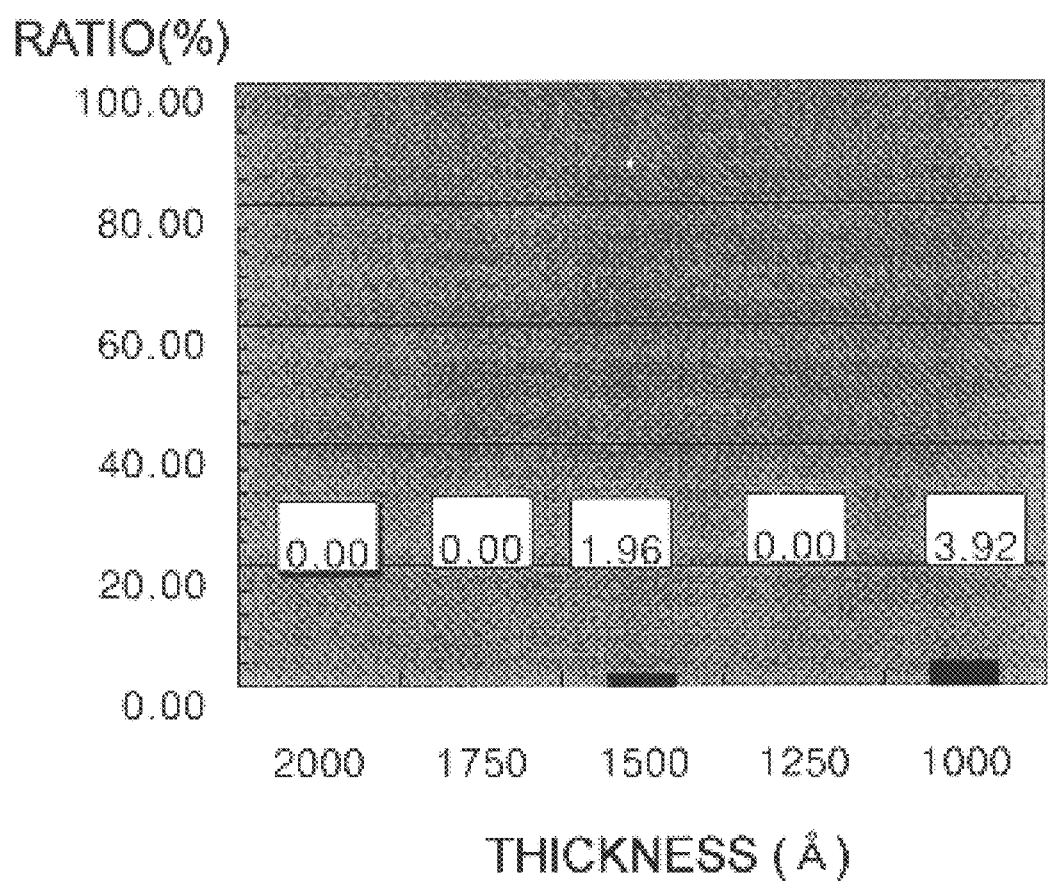

FIGS. 3A and 3B are graphs illustrating a ratio of short fail with respect to a ferroelectric layer according to the prior art and the present invention, respectively. The ratio of short fail is a probability that the capacitor is to be shorted. That is, the ratio of short fail according to the prior art is almost 100% at a ferroelectric layer thickness of below 1250 Å, and 56.390% at a ferroelectric layer thickness of 1500 Å, as shown in FIG. 3A. However, the ratio of short fail according to the present invention is 3.92% even at a ferroelectric layer thickness of 1000 Å, as shown in FIG. 3B.

Figure 4A:
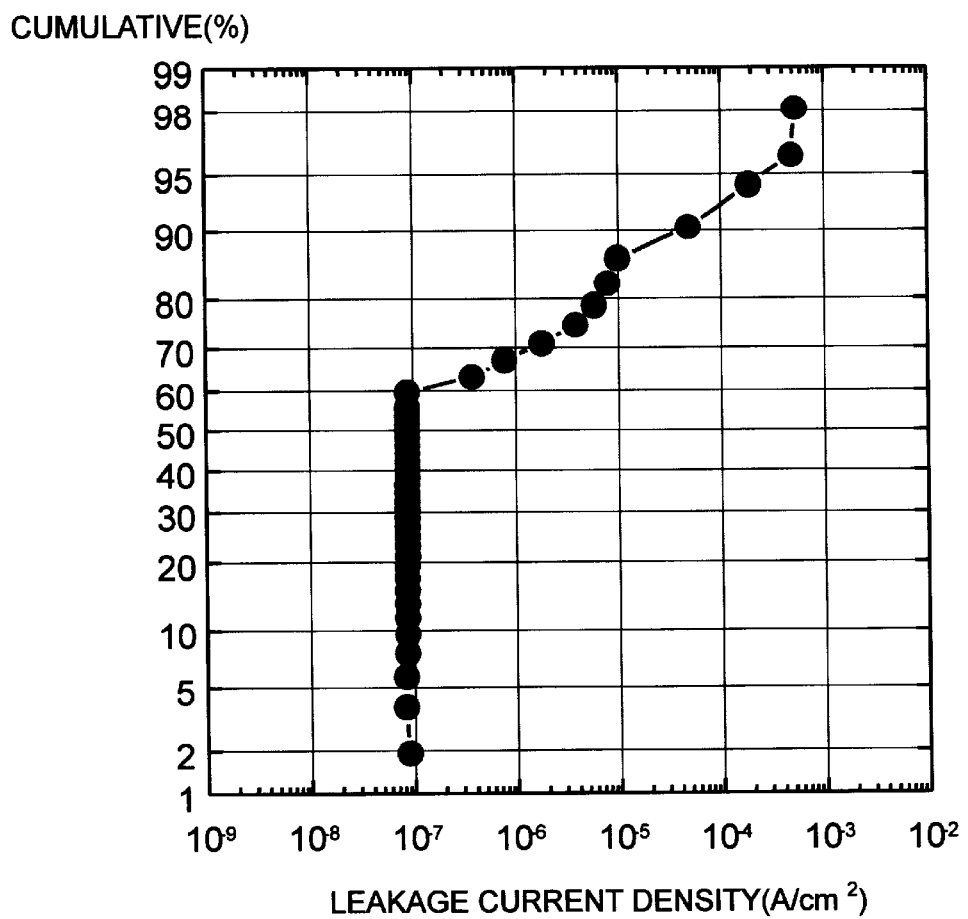
FIGS. 4A and 4B are graphs illustrating a leakage current density in accordance with the prior art and the present invention.
Figure 4B:
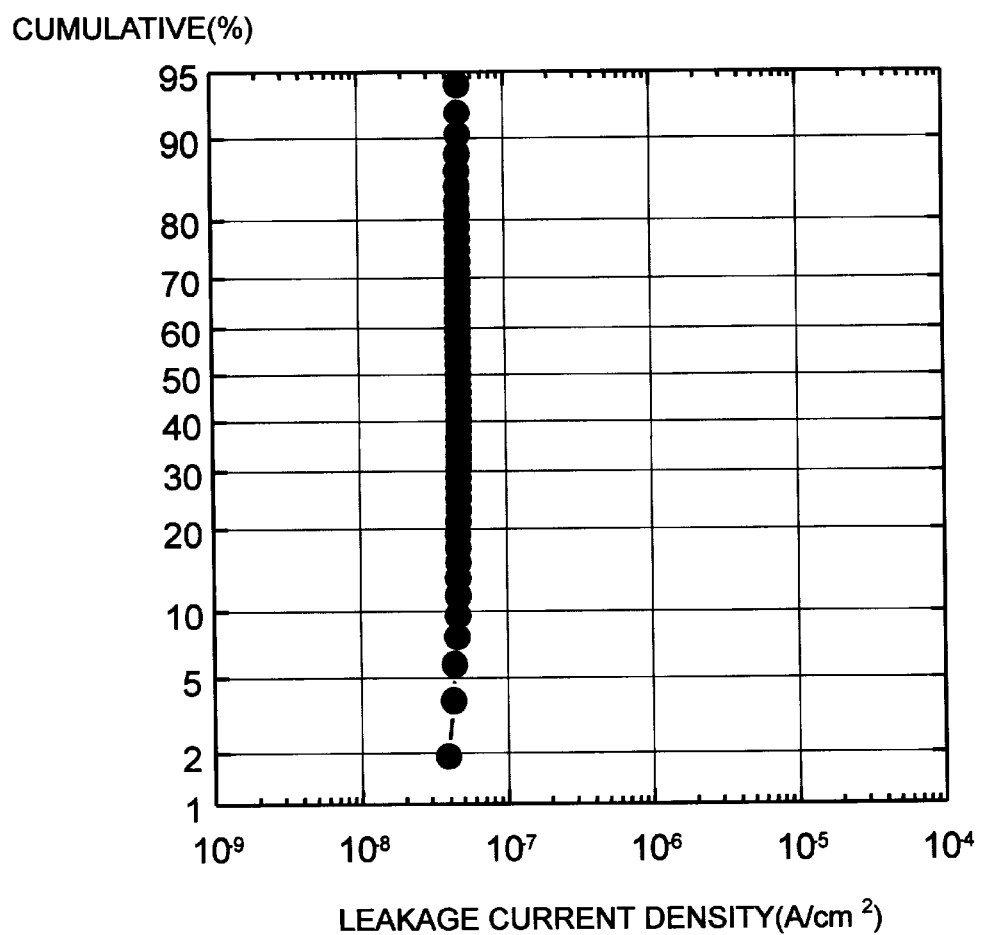

FIGS. 4A and 4B are graphs illustrating a cumulative statistic with respective to a leakage current density when a ferroelectric layer thickness is of 2000 Å according to the prior art and the present invention, respectively.

As shown in FIG. 4A, a percentage of capacitor to have the leakage current density below $10^{-7}$ ($A/cm^2$) is about 60% and a percentage of capacitor to have the leakage current density below $10^{-5}$ ($A/cm^2$) is about 90%. However, as can be seen from FIG. 4B, a percentage of capacitor to have the leakage current density below $10^{-7}$ ($A/cm^2$) is about 100%.

As described above, a characteristic of interface between the metallic electrode and the ferroelectric layer is improved, and the leakage current is decreased by protecting the interface boundaries from thermal damages, thereby improving the capacitor characteristics. Further, the interface detachments are prevented during the etching process and a thermal treatment, thereby improving the yield of the semiconductor memory device.

While the present invention has been described with respect to certain preferred embodiments only, other modifications and variation may be made without departing from the spirit and scope of the present invention as set forth in the following claims.

What is claimed is:

1. A method for fabricating a ferroelectric capacitor in ferroelectric memory device, comprising the steps of:

a) forming a first conductive layer on a semiconductor structure prepared for a formation of the ferroelectric capacitor;

b) forming a ferroelectric layer on said first conductive layer;

c) carrying out a rapid thermal annealing for nucleation in said ferroelectric layer;

d) forming a second conductive layer on said ferroelectric layer; and e) carrying out a thermal treatment for a grain growth in said ferroelectric layer.

2. The method as recited in claim 1, wherein said ferroelectric layer includes $Sr_xBi_yTa_2O_9$ and $Sr_xBi_y(Ti_iNb_j)_2O_9$, where x is 0.7 to 1.0, y is 2.0 to 2.6, i is 0.7 to 0.9, and j is 0.1 to 0.3.

3. The method as recited in claim 1, wherein the step c) is carried out at a temperature of 700° C. to 800° C. under an $O_2$ atmosphere for 0.4 to 0.6 minutes.

4. The method as recited in claim 2, wherein the step e) is carried out at a temperature of 700° C. to 800° C. under an $O_2$ atmosphere for 25 to 35 minutes.

5. A method for fabricating a ferroelectric capacitor in a ferroelectric memory device, comprising the steps of:

a) forming a first conductive layer on a semiconductor structure prepared for a formation of a ferroelectric capacitor;

b) forming a ferroelectric layer having a Bi-layered perovskite structure on said first conductive layer;

c) carrying out a rapid thermal annealing for nucleation in said ferroelectric layer;

d) forming a second conductive layer on said ferroelectric;

e) selectively etching said second conductive layer, said ferroelectric layer and said first conductive layer to form said ferroelectric capacitor;

f) carrying out a thermal treatment for compensating damages caused during an etching process and for promoting a grain growth in said ferroelectric layer;

g) forming an interlayer insulating layer, making planarization flow of said interlayer insulating layer, and carrying out a thermal treatment for a grain growth in said ferroelectric layer; and h) etching said interlayer insulating layer to expose said second conductive layer, and carrying out a thermal treatment to compensate damages occurred during an etching of said interlayer insulating layer and to promote a grain growth in said ferroelectric layer.

6. The method as recited in claim 5, wherein said ferroelectric layer includes $Sr_xBi_yTa_2O_9$ and $Sr_xBi_y(Ti_iNb_j)_2O_9$, where x is 0.7 to 1.0, y is 2.0 to 2.6, i is 0.7 to 0.9, and j is 0.1 to 0.3.

7. The method as recited in claim 6, wherein the step c) is carried out at a temperature of 700 to 800° C. in an $O_2$ atmosphere for 0.4 to 0.6 minutes.

8. The method as recited in claim 7, wherein the step f) is carried out at a temperature of 700 to 800° C. in an $O_2$ atmosphere for 25 to 35 minutes.

9. The method as recited in claim 8, wherein the step g) is carried out at a temperature of 750° C. to 850° C. in an $N_2$ atmosphere for 25 to 35 minutes.

10. The method as recited in claim 9, wherein the step h) is carried out at a temperature of 700° C. to 800° C. in an $O_2$ atmosphere for 25 to 35 minutes.

\* \* \* \* \*